United States Patent
Nakata et al.

(10) Patent No.: US 7,067,764 B2
(45) Date of Patent: Jun. 27, 2006

(54) MASK FOR LIGHT EXPOSURE AND METHOD FOR MANUFACTURING LIQUID CRYSTAL DISPLAY APPARATUS EMPLOYING SAME

(75) Inventors: Shinichi Nakata, Izumi (JP); Takayuki Ishino, Izumi (JP); Masami Yamashita, Izumi (JP)

(73) Assignee: NEC LCD Technologies, Ltd., Kanagawa (JP)

( * ) Notice: Subject to any disclaimer, the term of this patent is extended or adjusted under 35 U.S.C. 154(b) by 104 days.

(21) Appl. No.: 10/676,132

(22) Filed: Oct. 2, 2003

(65) Prior Publication Data

US 2004/0069757 A1 Apr. 15, 2004

(30) Foreign Application Priority Data

Oct. 10, 2002 (JP) ............................. 2002-297610

(51) Int. Cl.
*B23K 26/00* (2006.01)
*B23K 26/14* (2006.01)
*B23K 26/16* (2006.01)
*B23K 26/18* (2006.01)

(52) U.S. Cl. ............................. 219/121.69; 219/121.85

(58) Field of Classification Search ........... 219/121.69, 219/121.85, 121.68, 121.67
See application file for complete search history.

(56) References Cited

U.S. PATENT DOCUMENTS 6,816,207 B1 * 11/2004 Jung ............................. 349/15

FOREIGN PATENT DOCUMENTS

JP 2000-180894 6/2000

* cited by examiner

*Primary Examiner*—M. Alexandra Elve
(74) *Attorney, Agent, or Firm*—Young & Thompson

(57) ABSTRACT

Light exposure areas 103 and light masking areas 104 in a sole reticle are arrayed in alternation to one another in both the longitudinal and transverse directions. Substrate is exposed to light by multi-domain light exposure using this reticle so that the respective areas of the reticle exposed to light with respective shots A to B, B to C . . . , N to M are not adjacent to one another in the boundary portions of the reticle shifted for executing the respective shots, thus relaxing the difference in illuminance between the respective shots and the difference in finish of the boundary portions of the shots, such differences becoming imperceptible to human eyes upon displaying liquid crystal display apparatus.

9 Claims, 9 Drawing Sheets

BOUNDARY BETWEEN
SHOTS A AND H

SHOT A

SHOT H

SHOT a

BOUNDARY BETWEEN
SHOTS A AND H

SHOT A

SHOT a

SHOT b

SHOT B

MASK FOR LIGHT EXPOSURE AND METHOD FOR MANUFACTURING LIQUID CRYSTAL DISPLAY APPARATUS EMPLOYING SAME

FIELD OF THE INVENTION

This invention relates to a method for manufacturing a mask for light exposure and a liquid crystal display device employing the light exposure mask. More particularly, it relates to a mask for multi-domain light exposure in a photoresist process in forming a pattern on a substrate constituting a liquid crystal display device, and to a method for manufacturing the liquid crystal display device.

BACKGROUND OF THE INVENTION

In a manufacturing process for a thin-film transistor, abbreviated to TFT, as used in an active matrix liquid crystal display device, a batch light exposure system in which a TFT substrate is exposed to light at a time using a mirror projector type light exposure device, referred to herein as an aligner, and a multi-domain light exposure system, in which a TFT substrate is divided into plural domains for exposure to light using a lens type scan light exposure apparatus, referred to herein as a stepper, are nowadays in use.

Recently, there is an increasing demand for a larger size of a manufacturing apparatus for a liquid crystal display device in order to keep pace with the increasing size of the screen of the liquid crystal display device. As for a light exposure apparatus for a photoresist, an image frame is divided into plural domains, using a stepper, to effect light exposure from one domain to the next, whereby it is possible to cope with the increasing size of the image frame, even with a conventional light exposure apparatus. With this method, a light exposure shot system (FIG. 8) is used by a method shown in FIG. 7, in order that the volume of light exposure in the overlapping portions of junction areas of the plural domains will be uniform.

With this method, the optical system which exposes an end part of a reticle is provided with a blind 732 carrying a filter 731 presenting a gradient in transmittivity for smoothly changing the amount of light exposure at the junction of the boundary portions between shots of light exposure carried out in accordance with the multi-domain light exposure system. This produces moderate changes at the ends of the reticle, as indicated in a curve in a lower part of FIG. 8. The boundary portions are exposed to light in duplication to assure a uniform total light exposure volume.

However, the known system suffers from a drawback that the line of division is perceived at the time of display of the liquid crystal display device due to overlap deviation at the junction areas of the division or variations in illuminance of the exposure light. As a method for moderating the perceptibility of the division line, there is disclosed in Cited Reference 1 a method for complementary light exposure by plural neighboring masks.

This method is now explained with reference to FIG. 9. FIG. 9*a* shows a shot A 941 and a shot B 942 neighboring to each other in the transverse direction and an area of superposition 943 of these two shots A 941 and B 942. Referring to FIG. 9*b*, showing the area of superposition 943 to an enlarged scale, the shots are arranged in a random number fashion so that a larger number of the shots are distributed in an area proximate to the area of specific shots, in such a manner that the difference in luminance is not perceived by not providing a boundary line.

[Cited Reference 1]
Publication of JP Patent Kokai Publication JP-P2000-180894A (paragraph number [0016], FIGS. 9a and 9b).

SUMMARY OF THE DISCLOSURE

This method has a drawback that, while the boundary line becomes vague and imperceptible, the complementary light exposure leads to an amount of light exposure in the overlapping portion of light exposure which is relatively larger than that in the non-overlapping portion, due to bending over (diffraction) of the exposure light, thus producing the line width difference, with a result that, although the boundary line is imperceptible, only the overlapping area shows different illuminance. Thus there is much to be desired in the art.

It is an object of the present invention to provide a mask for light exposure by means of which boundary lines between different domains of the multi-domain light exposure system may not be perceived, and a method for producing a display device such as liquid crystal display employing such mask for light exposure.

According to an aspect of the present invention, there is provided a mask for light exposure. The mask has light shielding (masking) areas and light transmitting areas, wherein a plurality of first blocks having a preset pattern of light exposure and a plurality of second blocks not having a pattern for light exposure (i.e. having a pattern for masking) are formed in the same shape. The first and second blocks are arrayed in alternation with one another in both horizontal and transverse (i.e., x and y) directions. The first blocks of the mask for light exposure have a device pattern corresponding to at least one pixel of a display panel, e. g., liquid crystal panel. The first and second blocks are arrayed with a same pitch of repetition in alternation with one another in both the longitudinal and transverse directions.

According to a second aspect of the present invention, there is provided, e. g., liquid crystal display a method for manufacturing a display apparatus. The method comprises: providing a mask for light exposure composed of a plurality of first blocks of a preset pattern for light exposure and a plurality of second blocks not having a pattern for light exposure (i.e., a pattern for masking), and dividing a substrate, formed by arraying pixels in both the horizontal and transverse directions, into a plurality of rectangular domains of the same shape. Then the method comprises: carrying out a first light exposure operation for each of the rectangular domains, positioning the mask for light exposure relative to the substrate so that areas corresponding to the second blocks (not exposed to light by the first light exposure operation) are in register with the first blocks of the mask followed by carrying out second light exposure operation. To effect light exposure of the totality of pixels of the substrate, subsequent light exposure operations are carried out by repeating the first and second light exposure operations.

Further, the method is carried out so that the position of the mask for light exposure used for the second and the subsequent light exposure operations is shifted a length equal to a half the horizontal length and the transverse length, respectively, of the rectangular domains relative to the position of the mask for light exposure used for the first light exposure operation. In other words the shifting is carried out diagonally of a check block or the check pattern, preferably by registering a corner of a reticle pattern with a center of the previous exposed domain. The first and second blocks are arrayed a same pitch of repetition in alternation with one another in both the horizontal and transverse directions.

BRIEF DESCRIPTION OF THE DRAWINGS

FIG. 9a is a plan view for illustrating the principle of diminishing the difference in light exposure amount on the boundary between neighboring light exposure shots, and FIG. 9b is an enlarged plan view showing the boundary between the light exposure shots of FIG. 9b.

PREFERRED EMBODIMENTS OF THE INVENTION

Figure 1:
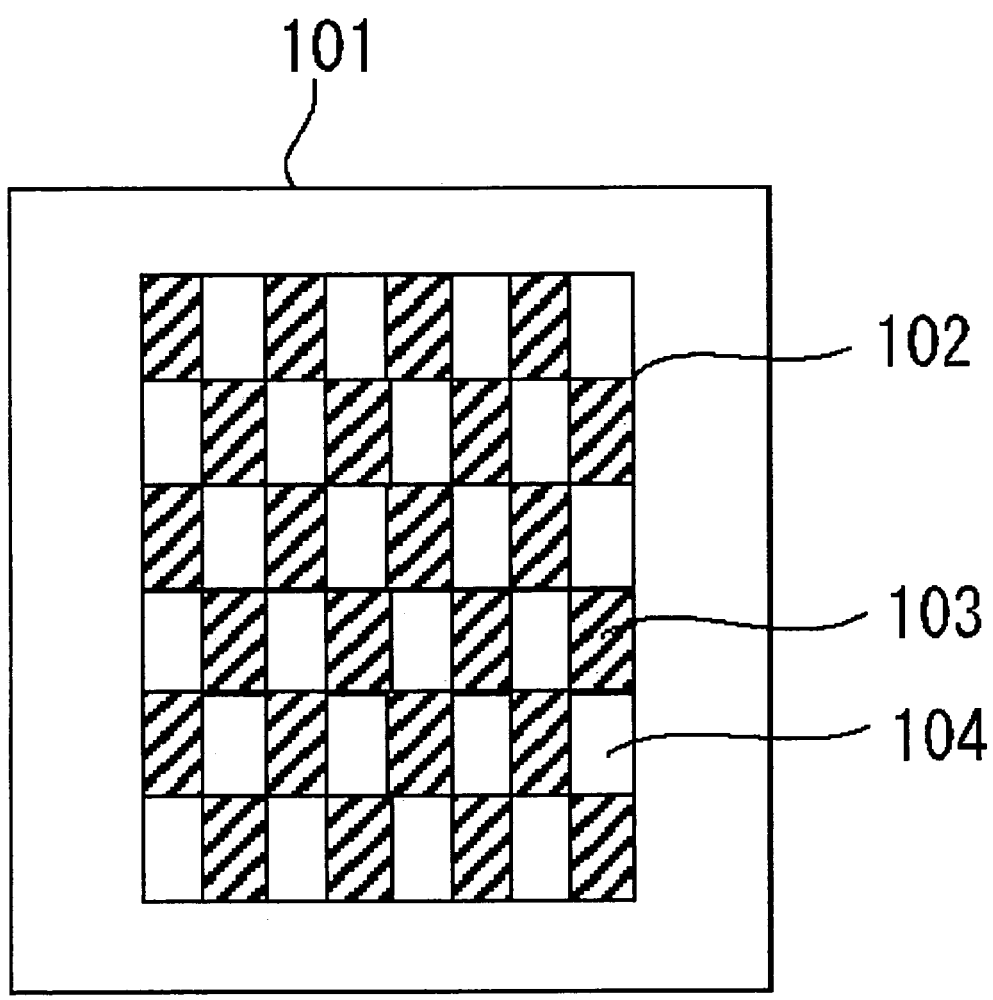
FIG. 1 is a plan view of a reticle for light exposure used in a first embodiment of the present invention.
Figure 3A:
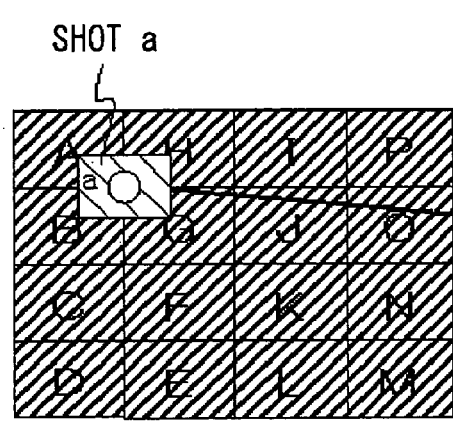
FIG. 3a is a plan view for illustrating a shooting layout of second light exposure shots using a reticle for light exposure and FIG. 3b is an enlarged plan view showing the boundary area of the light exposure shots.
Figure 3B:
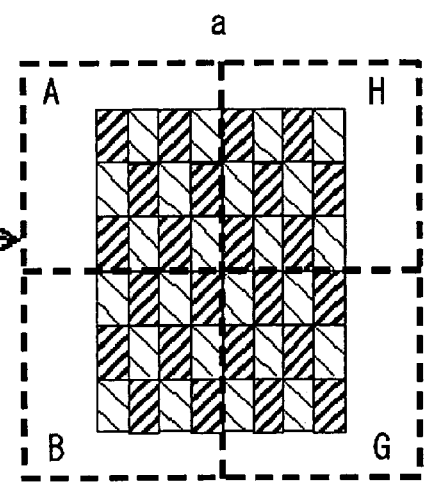
Figure 4A:
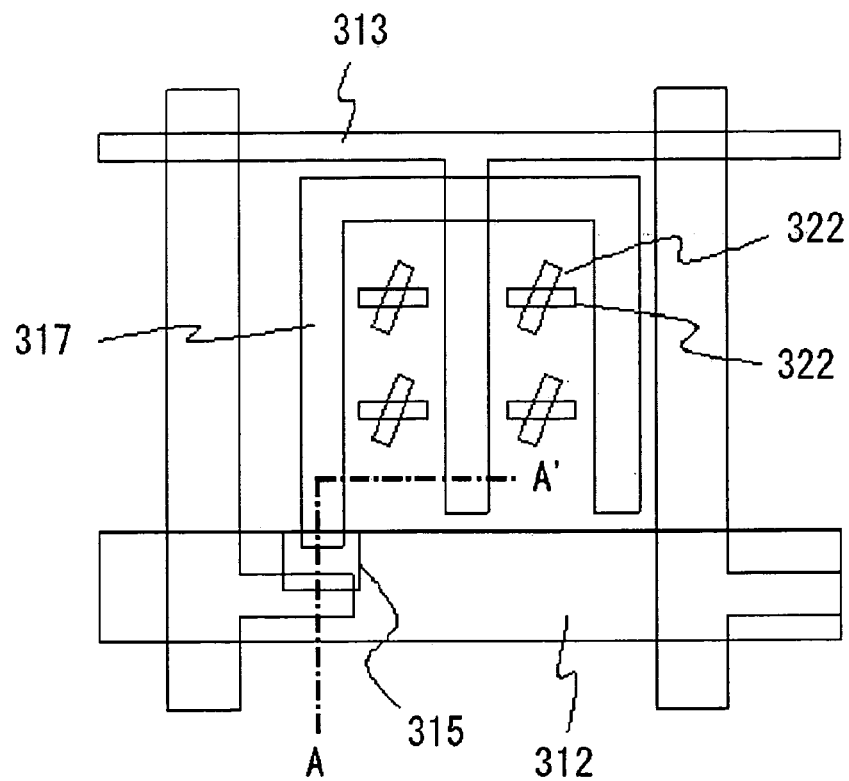
FIG. 4a is a plan view of a pattern of a TFT substrate for one pixel of the reticle for light exposure.
Figure 4B:
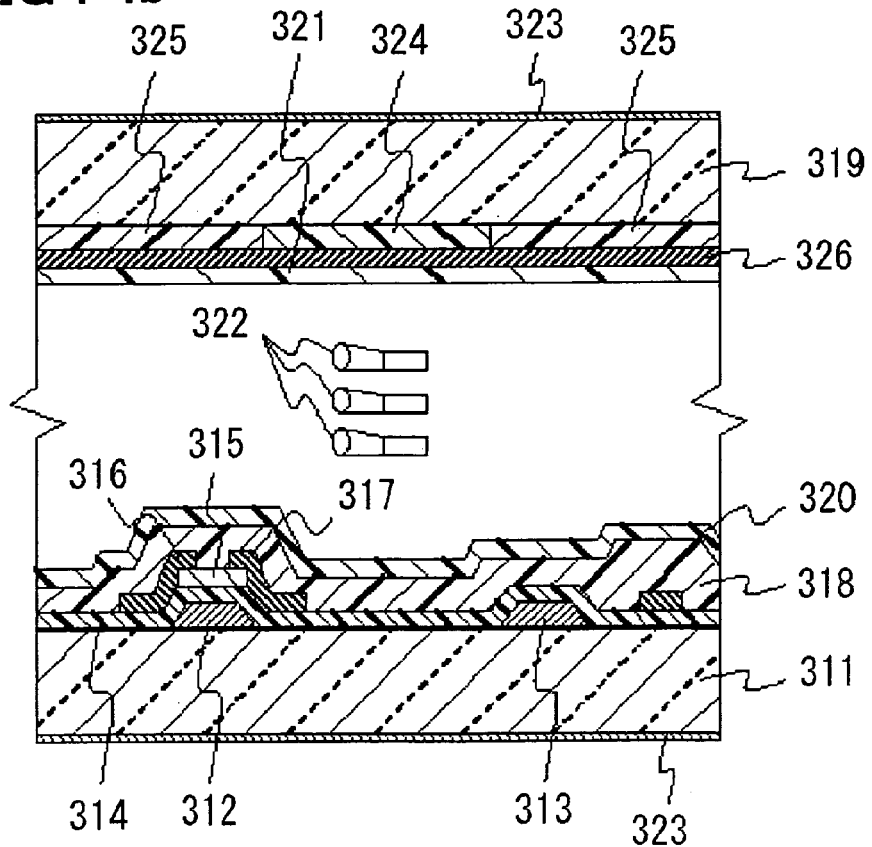
FIG. 4b is a cross-sectional view taken along line A–A' of FIG. 4b.
Figure 5A:
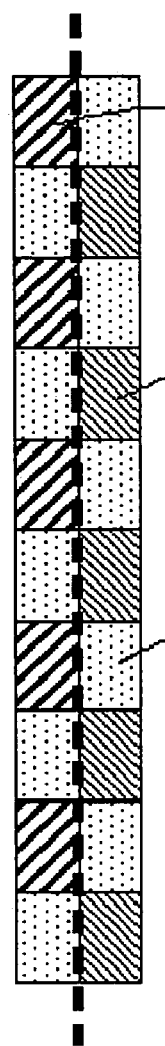
FIG. 5a shows how the second light exposure shot diminishes the difference in illuminance of the exposure light on the boundary area to the first light exposure shot.

Referring to FIGS. 1 to 5, a first embodiment of the present invention is now explained. FIG. 1 depicts a plan view of a reticle for light exposure, as used in the present invention. FIG. 2a depicts a plan view for illustrating a layout of the first light exposure shot by a reticle for light exposure, and FIG. 2b depicts an enlarged plan view of a boundary area of shots light exposure. FIG. 3a depicts a plan view (layout) for illustrating shooting manner of the second light exposure shot by a reticle for light exposure, and FIG. 3b depicts an enlarged plan view of a boundary area of the shots light exposure. FIG. 4a is a plan view of a TFT substrate pattern for one pixel of a reticle for light exposure, and FIG. 4b depicts a cross-sectional view of a liquid crystal panel taken along line A–A' of FIG. 4a. FIG. 5 depicts a graph for illustrating the manner of correction of the amount of light exposure of two neighboring shot areas by two light exposure shots.

Referring to the drawings, a shot area of a sole reticle 101 is designed so that plural light exposure domains 103 and plural light masking domains 104 are arrayed in alternation with one another (delta configuration) in horizontal and vertical directions, i.e., forming a check-like layout, as shown in FIG. 1.

Figure 2A:
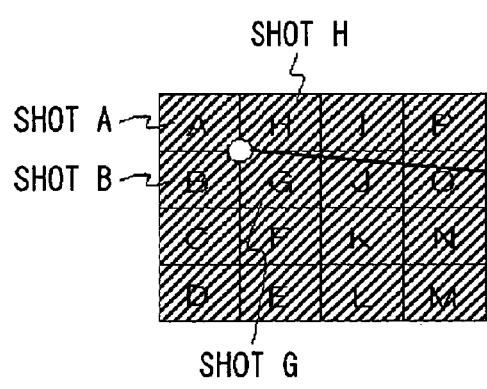
FIG. 2a is a plan view for illustrating a shooting layout of first light exposure shots using a reticle for light exposure and FIG. 2b is an enlarged plan view showing the boundary area of the light exposure shots.
Figure 2B:
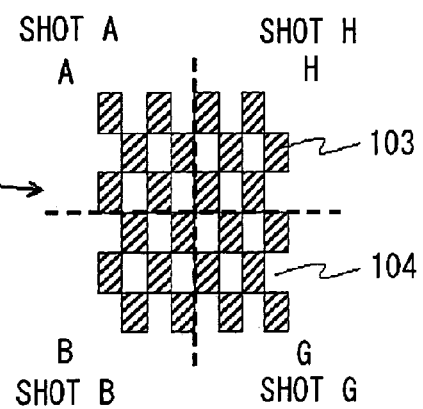

Using this reticle 101, a display area of the active matrix substrate of a liquid crystal panel is exposed to light by plural shots, as shown in FIG. 2a. In this case, the light exposure shots are constructed so that, in the boundary area of four neighboring light exposure shots A, B, H and G, the light exposure areas 103 are not neighboring to one another, that is, a light masking area 104 is adjacent to four sides of the light exposure areas 103, while another light exposure areas 103 are positioned on an extension of diagonal lines of the given light exposure area 103, as shown in FIG. 2a., making up a check-like layout.

A second light exposure shot is then carried out in order to expose portions of the display area of the active matrix substrate which were light masking areas in the first light exposure shot, as shown in FIG. 3a. In this case, the light exposure area 103 of the second light exposure shot is arrayed so that the edge of light exposure area 103 of the first light exposure shot is not overlapped with the edge of the light exposure area 103 of the second light exposure shot. This exposes the portions of the display area which were the light masking area in the first light exposure shot, as shown in FIG. 3b.

With the above method, it is possible to eliminate the inconvenience of producing boundary lines in the boundary areas of the multi-domain light exposure to allow the manufacture of an active matrix substrate capable of displaying an image of high image quality. The light exposure system of the present embodiment, inclusive of pattern arrangement of a reticle, used in the light exposure system, is now explained.

The reticle 101, used for multi-domain light exposure, is provided with a rectangular patterning area 102, in the vicinity of a normally square-shaped quartz wafer, as shown in FIG. 1. In this patterning area 102, plural light exposure areas 103 and plural light masking areas 104 are arranged in alternation with one another making up a check-like pattern layout, as shown in FIG. 1. These light exposure areas 103 and light masking areas 104 are arranged in association with respective pixels in the display area. It is assumed that the display area is now exposed to light using this reticle 101.

By way of the first light exposure operation, the display area is exposed to light as the display area is partitioned into plural shots, specifically, shots A, B, C . . . P, Q, N, M in this order, as shown in FIG. 2a. It is noted that light exposure shots are carried out so that the light exposure areas 103 and the light masking areas 104 are arranged in alternation with each other in the shot boundaries in both the horizontal and transverse (vertical) directions, in a matrix configuration, as shown in FIG. 2a.

The second light exposure shot is then carried out so that the areas which were the light exposure areas 103 and the light masking areas 104 are now the light masking areas 104 and the light exposure areas 103, respectively. With this second light exposure shot, the shot positions are set so-that the boundary of the light exposure area 103 in the first light exposure area is not overlapped with the boundary of the light exposure area 103 in the second light exposure area, and so that the centers of the shots A, B, G and H of the first light exposure shot is substantially coincident with the center of the reticle 101. By exposing the display area to light in this manner, the first area of light exposure and the second area of light exposure are arranged in a delta fashion, i.e., making up a check-like pattern, as shown in FIG. 3B.

The method for manufacturing the liquid crystal display apparatus of the present embodiment, as applied to an active matrix liquid crystal display apparatus of the parallel electrical field type (IPS system) is now explained. The liquid crystal display apparatus of the IPS system is configured as shown in FIG. 4. It is noted that FIG. 4*a* depicts a plan view of one pixel of the active matrix substrate, and FIG. 4*b* depicts a cross-sectional view of a liquid crystal display panel, taken along line A–A' of FIG. 4*a*.

First, a gate electrode 312 of Cr and a common electrode (COM electrode) 313 are formed on a glass substrate 311, and a gate insulating film 314 of silicon nitride is formed to overlie these electrodes. On the gate electrode 312 is formed a semiconductor film 315 of amorphous silicon, with the interposition of a gate insulating film 314, for operating as an active layer for a transistor.

A drain electrode 316 of Cr and a source electrode 317 are formed so as to partially overlap with the pattern of the semiconductor film 315. A protective film 318 of silicon nitride is formed so as to cover up all of these underlying layers. One pixel area is arranged between the common electrode 313, disposed parallel to the source electrode 317, and the source electrode 317. On the surface of the active matrix substrate, on which a large number of unit pixels described above are arranged in a matrix configuration, there is formed an oriented film 320 having a rubbed surface.

The glass substrate 311 and a glass substrate 319 on the opposite face each other by the oriented films 320, 321 and the oriented film forming surfaces, and a liquid crystal composition 322 is placed in-between.

A deflecting plate 323 is formed on an outer surface of the glass substrate 311, while another deflecting plate 323 is formed on an outer surface of the opposite side glass substrate 319. On a side directed to the liquid crystal composition 322 of the opposite glass substrate 319 are formed a color filter layer 324 and a light masking layer 325 in the same layer and are covered by a protective film 326 and the oriented film 321. The light masking layer 325, delimiting the color filter layer 324, has its portion arranged over a thin-film transistor formed by a semiconductor film 315.

If, with the above-described active matrix liquid crystal display apparatus, no electrical field is applied to the liquid crystal composition, the molecules of the liquid crystal are substantially parallel to one another in a direction of parallel extension of the source electrode 317 and the common electrode 313, and are oriented homogeneously. That is, the liquid crystal molecules are oriented such that the direction of the long axis (optical axis) of the liquid crystal molecules is at an angle of not less than 45° and less than 90° with respect to the direction of the electrical field defined between the source electrode 317 and the common electrode 313. Meanwhile, the glass substrate 311 and the opposite side glass substrate 319 are parallel to the orientation of the liquid crystal molecules. The dielectric constant anisotropy of the liquid crystal molecules is positive, in this case.

The manufacturing method of the present embodiment is used when forming an electrode pattern on a glass substrate, as an example.

The electrode pattern is formed by first forming a Cr film on the entire surface of a glass substrate, then forming a resist layer thereon and exposing the resist layer to light in accordance with a preset pattern followed by etching.

Upon exposing the resist layer to light, in the present embodiment, the glass substrate is partitioned into plural areas, as shown in FIG. 2*a*, and first light exposure is carried out. In the embodiment illustrated, a display zone is divided into 16 equal portions for shots A, B, . . . , M for light exposure, and shooting is carried out using a separate mask for the peripheral area around the display zone. The reticle used for this light exposure includes plural light exposure areas and plural light masking areas, arrayed in alternation with one another, in both the horizontal and transverse (vertical) directions, in a matrix configuration, with division of the matrix corresponding to one pixel or several pixels, as shown in FIG. 1.

The boundaries of the respective shots are such that the respective light exposure areas and the light masking areas of the shots A, B, H and G are adjacent to one another. The second light exposure then is carried out using a reticle of which the light exposure areas are located in register with the areas of the glass substrate corresponding to the light masking areas of the second light exposure. In other words, essentially a reversal pattern of that of the reticle at the first light exposure shot is used. It is noted that the second light exposure shots are carried out by placing the reticle so that the center of the first shots A, B, H and G is substantially in register with the center of the reticle, as shown in FIG. 3*a*. The result is that light exposure areas of the second light exposure are located in register with the portions of the glass substrate which were the light masking areas during the first light exposure (light masking area of FIG. 2*b*), so that the light exposed state is now at a state as shown in FIG. 3*b*.

In the similar manner, light exposure is carried out as the light exposure areas (patterns) of a reticle are positioned so that the centers of the first light exposure shots B, G, G and H are located substantially in register with the center of the reticle, as shown in FIG. 3*a*. Namely, a reversal pattern (reversal reticle in essence) of that of the reticle at the first light exposure shot is used at the second light exposure shot. The result is that light exposure is carried out so that the areas of the second light exposure operation are located in register with the portions of the substrate which were the light masking areas in the first light exposure (light masking areas of FIG. 2*a*), as indicated in FIG. 3*b*.

Figure 5B:
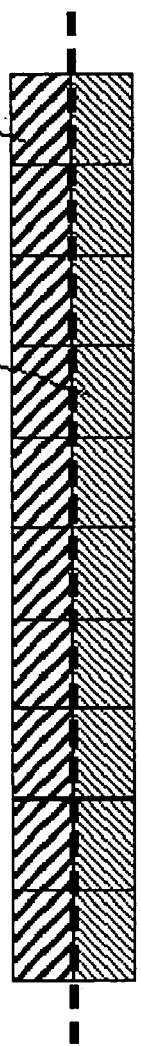
FIG. 5b shows how the difference in illuminance of conventional light exposure shots directly presents itself on the boundary area.

As may be seen from the foregoing, if the method for light exposure of the present embodiment is followed, with the aid of the reticle of the present embodiment, the areas exposed to light with the respective shots in the boundary portions of the reticle exposed to light by multi-domain light exposure are not adjacent to each other, thus relaxing or eliminating the difference in illuminance among the respective shots, as shown in FIG. 5*b*.

More specifically, with the method in which the light exposure zone is divided into plural portions and each such portion is exposed to light only once, if there is any significant difference in illuminance between the light exposure shots A and H, the difference in illuminance is directly presented in the boundary area between the shots, as shown in FIG. 5*b*. With the present method in which not only the display zone is divided into plural domains, but also the light exposure operation for each domain is carried out by a plurality of light exposure operations, should there be any significant difference in light illuminance between the shots A and H of the first light exposure operation, only one half of the pixels in the light exposure shots A and H are affected by such difference in illuminance. In the second light exposure operation, no difference in illuminance is produced because the same shot is applied to the boundary portion of the light exposure shots A and H. This relaxes the difference in finish of the boundary portions of the shots from the illuminance on the shot boundary of the first light exposure, such differences becoming imperceptible to human eyes.

Figure 6A:
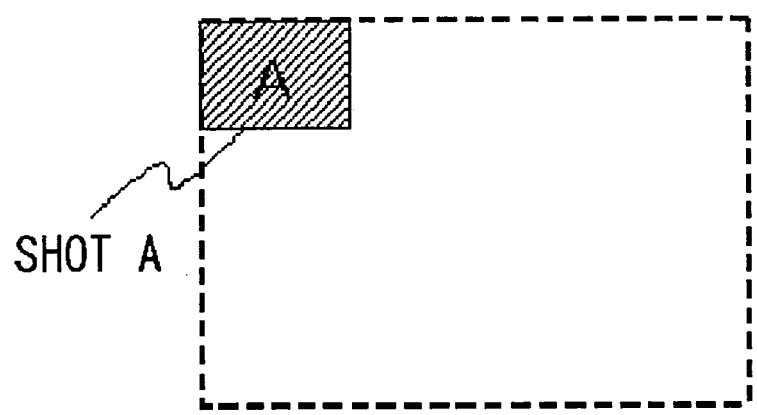
FIGS. 6a, 6b and 6c are plan views of a layout of reticle for individual light exposure shots used in a second embodiment of the present invention.

Referring to FIG. 6, the second embodiment of the present invention is now explained. In the present second embodiment, light exposure shots are carried out using the reticle of FIG. 1 which is the same as that of the first embodiment. However, the present second embodiment differs from the first embodiment in shot map (i.e., shot layout).

Figure 6B:
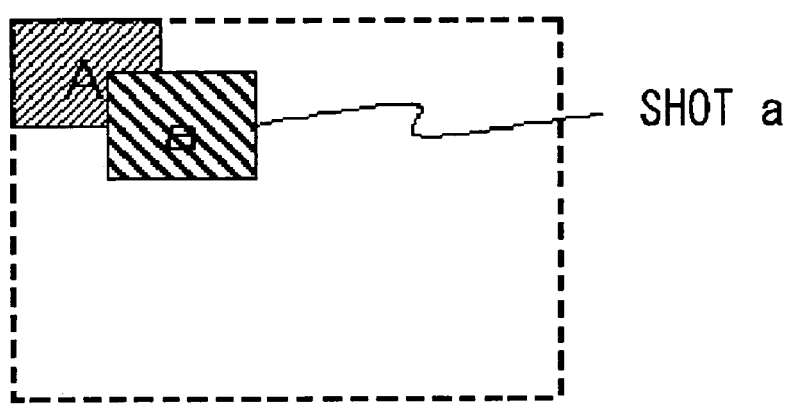
Figure 6C:
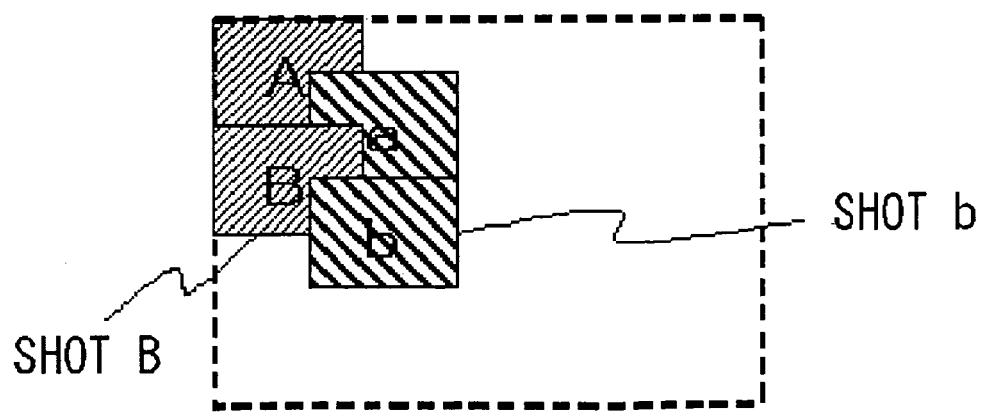
Figure 7:
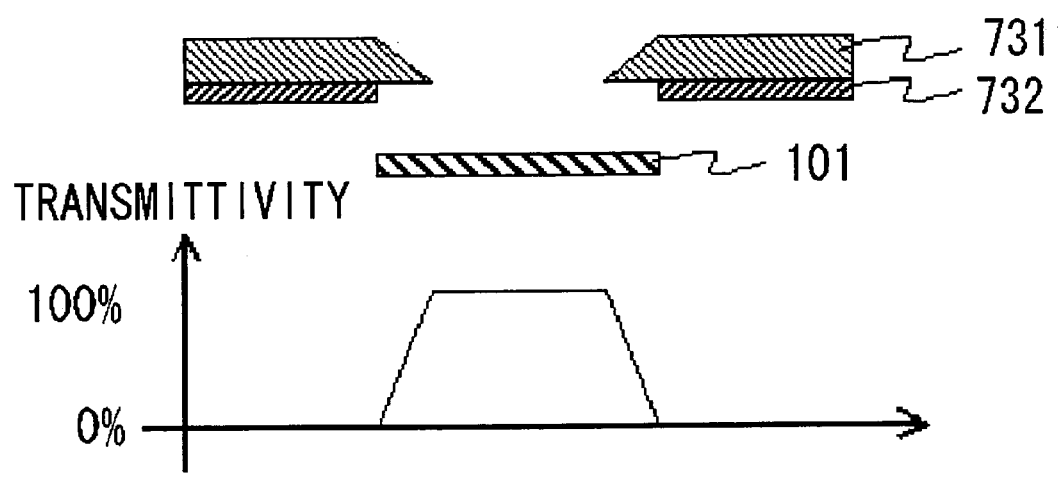
FIG. 7 is a cross-sectional view showing a conventional method for light exposure in which the volume of light exposure of overlapping portions between two light exposure shots is uniform.
Figure 8:
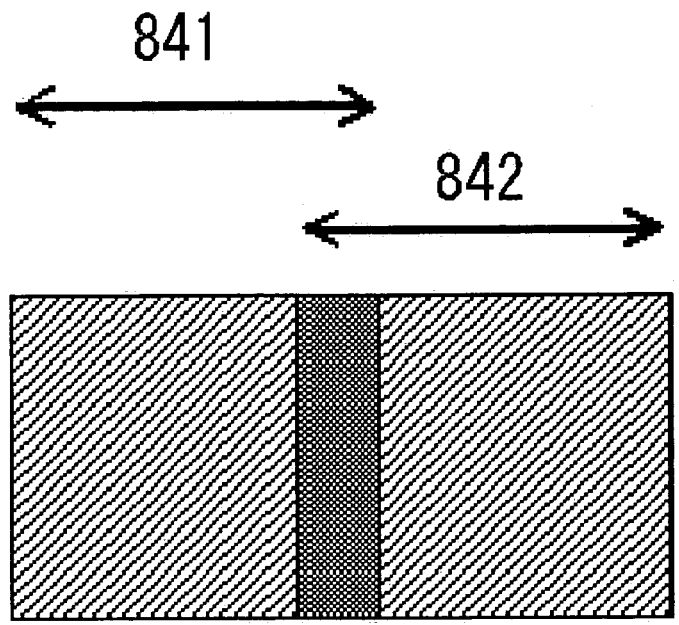
FIG. 8 illustrates the principle in which, in the method for light exposure shot shown in FIG. 7, the amounts of light exposure in two neighboring light exposure shots are made equal to each other.
Figure 8:
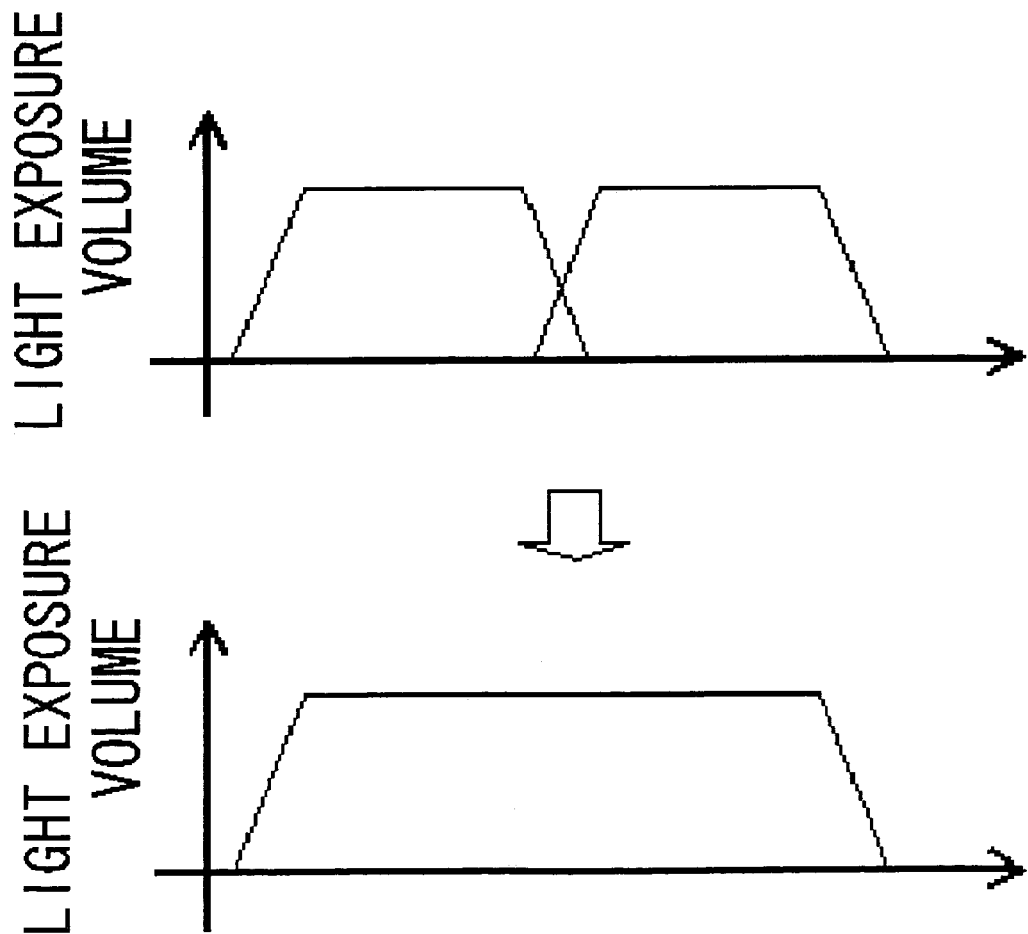
Figure 9A:
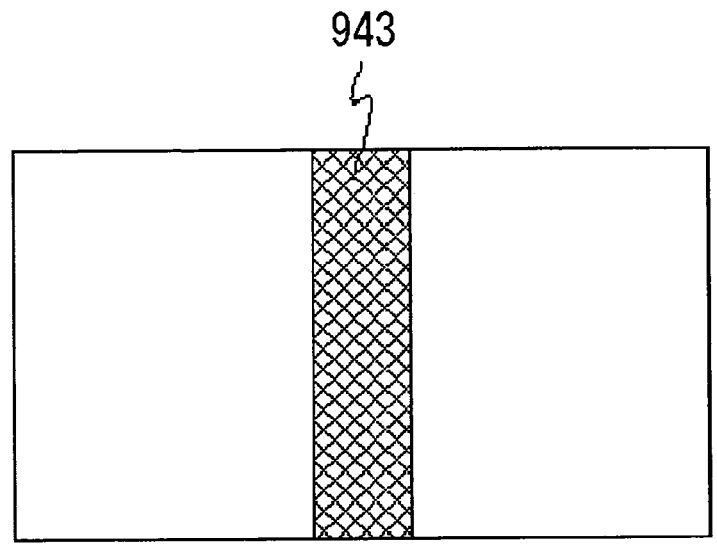
FIGS. 9a and 9b show another conventional method for light exposure, where
Figure 9A:
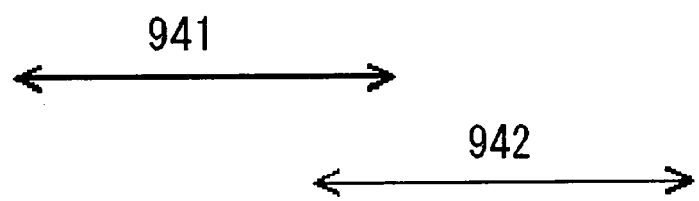
Figure 9B:
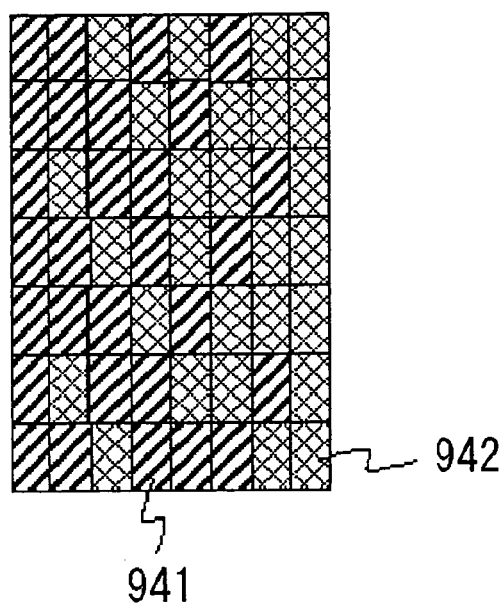

Specifically, the shot A is carried out first, as shown in FIG. 6 at a corner of the entire exposure area. The reticle then is shifted in the diagonal direction a length equal to a half the length of the diagonal line to carry out a shot a (FIG. 6b). The reticle then is shifted to a position directly below shot A to carry out a shot B, then shifted in the diagonal line a length equal to a half the diagonal line to carry out a shot b (FIG. 6c), and so forth, in order to carry out light exposure sequentially. It should be noted that, in an area of each current shot overlapping with an area of a directly previous shot, the light exposure area of the current shot is located in register with the light masking area of the previous shot. With the present method, since the shortest movement distance of the reticle from one shot to the next suffices, while the change in the illuminance of the light exposure, attendant on changes of the apparatus with lapse of time, is also small, the difference in illuminance from one shot to the next may be suppressed to a smaller value than in the light exposure method of the first embodiment.

The meritorious effects of the present invention are summarized as follows.

According to the present invention, the light exposure areas and the light masking areas in a sole reticle are arranged in alternation to one another in both the horizontal and transverse (vertical) directions, and the substrate is exposed to light by multi-domain light exposure using this reticle. Since the substrate is exposed to light by multi-domain light exposure so that the respective areas of the reticle exposed to light with respective shots are not adjacent to one another in the boundary portions of the reticle, shifted for executing the respective shots, thus relaxing the difference in illuminance between the respective shots and the difference in finish of the boundary portions of the shots, such differences becoming imperceptible to human eyes.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A method for manufacturing a display apparatus comprising:
   providing a mask for light exposure composed of a plurality of first blocks having a preset pattern of light exposure and a plurality of second blocks as a pattern for masking,
   dividing a substrate, formed by arraying pixels in both horizontal and transverse directions, into a plurality of rectangular domains of a same shape,
   carrying out a first light exposure operation for each of said rectangular domains,
   positioning said mask relative to said substrate so that areas, corresponding to the second blocks, of said rectangular domains not exposed to light by the first light exposure operation are in register with the first blocks of said mask, and carrying out second light exposure operation.

2. The method for manufacturing a liquid crystal display apparatus as defined in claim 1 wherein the method is carried out by shifting the position of the mask for light exposure used for the second light exposure operation by a length equal to each a half a horizontal length and a transverse length of said rectangular domains relative to the position of the mask for light exposure used for said first light exposure operation.

3. The method as defined in claim 2, wherein said shifting is repeated for carrying out a light exposure operation subsequent to said second light exposure operation.

4. The method for manufacturing a liquid crystal display apparatus as defined in claim 1 wherein the first and second blocks are arrayed with a same pitch of repetition in alternation with one another in both the longitudinal and transverse directions.

5. A method for manufacturing a display apparatus comprising:
   providing a mask for light exposure composed of a plurality of first blocks of a preset pattern for light exposure and a plurality of second blocks for masking,
   dividing a substrate, formed by arraying pixels in both horizontal and transverse directions, into a plurality of rectangular domains of the same shape,
   carrying out a first light exposure operation through the first blocks of said mask for each of said rectangular domains,
   positioning said mask for light exposure relative to said substrate so that areas corresponding to the second blocks not exposed to light by the first light exposure operation are in register with the first blocks of said mask,
   carrying out second light exposure operation, and carrying out subsequent light exposure operations by repeating said first and second light exposure operations to effect light exposure of the totality of pixels of said substrate.

6. The method as defined in claim 5, wherein said blocks have a device pattern corresponding to at least one pixel of a display panel.

7. The method as defined in claim 5, wherein said first and second blocks are arrayed at a same pitch of repetition in alternation with one another in both the horizontal and transverse directions.

8. The method as defined in claim 5, wherein said first blocks and said second blocks are arrayed in said mask making up a check pattern.

9. The method as defined in claim 8, wherein said first blocks and second blocks are arrayed so that, when repeated in at least one of horizontal and transverse directions, any array is ended by a block which is a reversal of a light exposing block or masking block.

* * * * *